United States Patent

Goebel et al.

[11] Patent Number: 5,541,140
[45] Date of Patent: Jul. 30, 1996

[54] SEMICONDUCTOR ARRANGEMENT AND METHOD FOR ITS MANUFACTURE

[75] Inventors: Herbert Goebel; Vesna Biallas; Richard Spitz, all of Reutlingen; Anton Mindl, Tuebingen, all of Germany

[73] Assignee: Robert Bosch GmbH, Stuttgart, Germany

[21] Appl. No.: 264,543

[22] Filed: Jun. 23, 1994

[30] Foreign Application Priority Data

Jun. 23, 1993 [DE] Germany .......................... 43 20 780.4

[51] Int. Cl.$^6$ ....................... H01L 21/302; H01L 29/861
[52] U.S. Cl. .......................... 437/226; 437/81; 437/158; 437/235; 437/245; 257/603; 257/605
[58] Field of Search .................... 257/603, 605; 437/81, 226, 158, 235, 245

[56] References Cited

U.S. PATENT DOCUMENTS 3,264,149  8/1966  Batdoff .................................... 257/605

FOREIGN PATENT DOCUMENTS 4130247  3/1993  Germany .

*Primary Examiner*—Edward Wojciechowicz
*Attorney, Agent, or Firm*—Kenyon & Kenyon

[57] ABSTRACT

Semiconductor arrangements, in particular diodes, have a p-layer and two n-layers that are doped to varying degrees of thickness. The p-n junction between the p-layer and the heavily doped n-layer is arranged in the chip so as to allow it to lie completely inside the chip. The p-n junction between the p-layer and the n-layer is situated in the outside areas of the chip. This arrangement does not permit any high field strengths to occur on the outside of the chip and, at the same time, it makes it possible for easily reproducible properties to be achieved. The manufacturing method can also be carried-out outside of a clean room.

4 Claims, 1 Drawing Sheet

SEMICONDUCTOR ARRANGEMENT AND METHOD FOR ITS MANUFACTURE

FIELD OF THE INVENTION

The present invention relates to semiconductor arrangements and to methods for manufacturing semiconductor arrangements.

BACKGROUND INFORMATION

German Patent Application No. 41 30 247 describes semiconductor arrangements having p-n junctions. In these semiconductor arrangements, however, p-n junctions are arranged between heavily doped p-layers and heavily doped n-layers in the vicinity of the top surface as well. A relatively large expenditure is required in order to avoid this.

SUMMARY OF THE INVENTION

In the semiconductor arrangement according to the present invention, p-n junctions are placed using especially simple means between heavily doped regions inside the silicon chip. Therefore, no measures are needed to shield the high field strengths occurring at such p-n junctions. In the method according to the present invention, these types of semiconductor arrangements are manufactured using very few and inexpensive process steps.

Since the second layer is made up altogether of three partial layers, each of the individual partial layers can assume a specific function. In particular, by properly doping the first layer and the third partial layer, an especially simple contacting of the semiconductor element can be undertaken. The structure of the semiconductor element is rendered especially simple by having the first layer, and the second and third partial layers extend, in each case, over the entire cross-section, and by having the first partial layer extend only over the middle area of the semiconductor chip. The smooth formation of the top side allows the contacting of the chip to take place with especially simple means. Chips, which only have a smooth top surface in their middle region, are able to be produced with especially simple means.

The manufacturing method according to the present invention makes it possible for semiconductor devices to be manufactured using especially simple means, outside of a clean room as well. The pits can be alternatively introduced by means of etching or sawing. The surface of the p-n junction may be exactly defined with a single exposure step.

DETAILED DESCRIPTION

Figure 1:
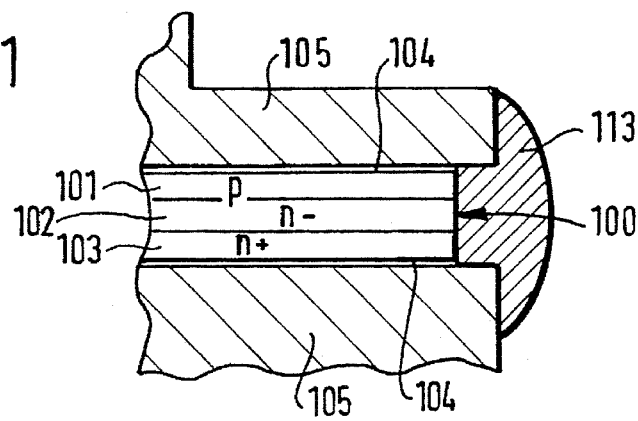
FIGS. 1 and 2 illustrate first and second semiconductor arrangements of the prior art.

FIG. 1 depicts a semiconductor element, a diode, in accordance with existing prior art. In the case of this diode, a semiconductor chip 100 is arranged between two metallic connections 105. Between the metallic connections 105 and the semiconductor chip 100, a metallic coating for the chip 100, or rather a solder layer 104 is provided, which ensures an electrical and mechanical contacting between the chips 100 and the metallic connections 105. The chip 100 has a p-layer 101 and an n-layer made up of two partial layers 102, 103. Of these two partial layers, the less doped partial layer 102 forms the p-n junction with the p-layer 101. The doping of the p-layer 101 and the bottom n-partial layer 103 are selected to be high enough to ensure an ohmic contact with the metallic coatings 104 and, thus, also with the connections 105. The doping of the upper n-partial layer 102 is selected so as to ensure adequate blocking performance characteristics for the diode. A typical doping for the partial layer 102 lies on the order of magnitude of $10^{14} cm^{-3}$ and, for the more heavily doped partial layer 103, on the order of magnitude of $10^{20} cm^{-3}$. In its edge area, the silicon chip 100 is protected by a passivation 113. This passivation 113 can consist, for example, of a glass solder or of a suitable plastic. This protection provided by the passivation 113 is particularly necessary since a strong voltage drop and, therefore, a large field strength occurs at a p-n junction.

Because of such a field strength, undesirable particle accumulations or chemical reactions with surrounding media can then occur at an exposed p-n junction. The field strength is a function of the dopant concentration. Due to the relatively low concentration of the partial layer 102, the field strengths are relatively low in the case of the present diode, and a passivation produced by the layer 113 is adequate.

Figure 2:
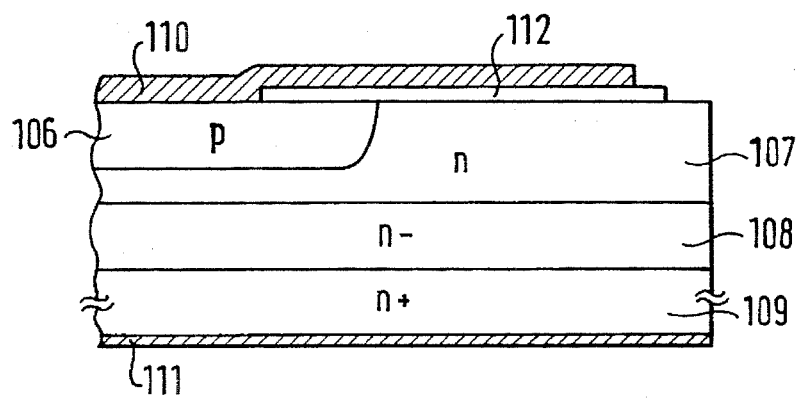

FIG. 2 depicts another example, in this case of a Zener diode. The Zener diode is made up of a p-layer 106, a normally doped n-partial layer 107, a weakly doped n-partial layer 108, and a heavily doped n-partial layer 109. The doping of the p-layer 106 and of the n-partial layers 108 and 109 correspond more or less to the doping known from FIG. 1, to the p-layer 101, and to the n-partial layer 102 and 103. The doping of the n-partial layer 107 lies on the order of magnitude of $10^{18} cm^{-3}$, thus between the doping of the n-partial layer 108 and the n-partial layer 109. The p-n junction is formed in this case between the p-layer 106 and the normally doped n-partial layer 107. Applying this n-partial layer 107 allows the avalanche voltage of the Zener diode to be adjusted quite well and with reproducibility. What is problematical about this structure, however, is that there is now a p-n junction between the comparatively more heavily doped regions on the top surface of the silicon chip. Therefore, a passivation 112 of silicon oxide is provided on the top side of this silicon chip, which is arranged, in addition, below the connection metallic coating 110. This arrangement produces a shielding of the p-n junction formed between the p-layer 106 and the n-partial layer 107, so that the high field strengths of this p-n junction cannot adversely affect the properties of the diode. The connection of the metallic coating 110 and 111 to corresponding connections takes place analogously to FIG. 1.

However, improving the properties of the diode, as achieved in the case of the diode according to FIG. 2, requires increased expenditure to manufacture this diode. The diode according to FIG. 1 can, namely, also be manufactured outside of a clean room, so no lithographic steps whatsoever are required. On the other hand, in accordance with the diode of FIG. 2, several lithographic steps must be carried out under clean-room conditions, to guarantee the necessary structuring of the p-layer 106, of the passivation layer 112, and of the metallic coating 110.

Figure 3:
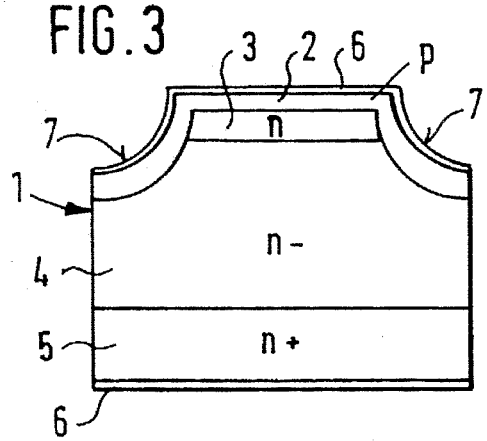
FIGS. 3 and 4 illustrate first and second exemplary embodiments of the semiconductor arrangement according to the present invention.

A first exemplary embodiment of the present invention is shown in FIG. 3. This is a Zener diode that is comprised of a p-layer 2, and of an n-layer consisting of several partial layers 3, 4 and 5. The doping of the p-layer 2 corresponds in this case to the doping of the p-layer 106 of FIG. 2; and the doping of the n-partial layers 3, 4 and 5 corresponds to the doping of the n-partial layers 107, 108 and 109 of FIG. 2. A metallic coating 6, through which the diode can be contacted, is provided in each case on the top side and the bottom side of the silicon chip 1. In its middle area, the top side of the silicon chip 1 has a smooth top surface, while the edge area has a recessed step 7. The p-layer 2 covers the top side of the silicon chip 1 all over with more or less the same thickness, so that the geometric structure of the surface of the chip 1 also corresponds to the boundary surface of the p-layer 2 next to the n-partial layers 3 or 4. In each case, the p-layer 2 forms a p-n junction with the n-partial layer 3 and the n-partial layer 4.

The n-partial layer 3 is only formed in this case below the flat middle area of the top side of the silicon chip 1. The n-partial layers 4 and 5 are formed in each case over the entire cross-section of the chip 1. The heavily doped n-partial layer 5 is only in contact with the weakly doped n-partial area 4. The weakly doped n-partial layer 4 is in contact in the edge area with the p-layer 2 and, inside the middle area of the chip 1, with the n-partial layer 3. However, since the doping of the n-layer 3 is greater than the doping of the n-layer 4, the properties of the diode are exclusively determined by the p-n junction between the p-layer 2 and the n-partial layer 3. Because the n-partial layer is formed exclusively in the middle area of the silicon chip 1, the p-n junction between the p-layer 2 and the n-partial layer 3 does not touch the surface of the silicon chip 1 at any point. Thus, nowhere on the surface of the silicon chip 1 do high field strengths occur, which would require special shielding measures. The p-n junction between the p-layer 2 and the n-partial layer 4 is not problematical, since it can only produce low field strengths because of the low dopant concentration of the n-partial layer 4.

Figure 4:
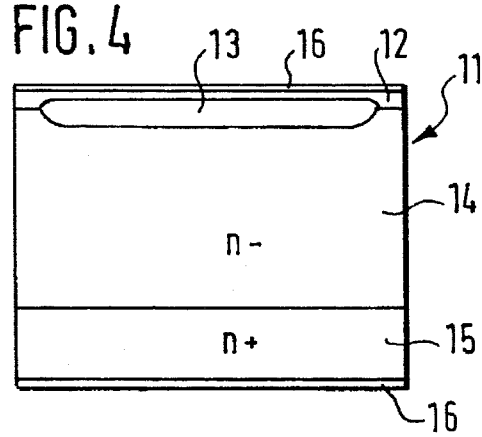

FIG. 4 illustrates another exemplary embodiment of the present invention. This, again, is a Zener diode, which is made up of a p-layer 12 and of an n-layer including three partial layers 13, 14, and 15. The doping of the p-layer 12 corresponds in this case to the doping of the p-layer 2; the doping of the n-partial layers 13 through 15 corresponds to the doping of the n-partial layers 3 through 5. A metallic coating 16, which serves to connect the diode, is applied to the top side and bottom side of the silicon chip 11. The p-layer 12 and the n-partial layers 14 and 15 each extend over the entire cross-section of the silicon chip 11. The n-partial layer 13 is only formed in the middle area of the silicon chip 11, so that the p-n junction being formed between the p-layer 12 and the n-partial layer 13 is situated exclusively inside the silicon chip 11 and at no point is in contact with the top surface. On the other hand, the p-n junction between the p-layer 12 and the n-partial layer 14 is arranged in the edge area of the silicon chip 11 and touches the top surface. However, due to the low dopant concentration, this p-n junction situated on the top surface is not problematical.

In comparison to the diode according to FIG. 2, the diodes according to FIGS. 3 and 4 are able to be manufactured with fewer process steps. In this case, one can reduce the number of process steps that have to be carried out in the clean room. Also, when Zener diodes are introduced in each case in FIGS. 3 and 4, the principles of the present invention can also be applied to other semiconductor arrangements as well, which have a p-n junction between a heavily doped p-layer and a heavily doped n-layer with a subsequently applied, more weakly doped n-layer. Components in which all the p-layers and n-layers are reversed can also be used.

To manufacture a diode according to FIG. 4, one initially starts out from a weakly n-doped silicon wafer, the dopant concentration corresponding to the dopant concentration of the subsequently added n-partial layer 14. In a further process step, the wafer is covered with a masking layer, for example silicon oxide, by means of an oxidation process. By means of a photographic process, windows are introduced into this masking layer. The geometric dimensions of the n-partial layer 13 are defined by these windows, since a dopant for an n-lead, for example phosphorous, is introduced through these windows into the wafer. This can be achieved, for example, by an implanting process or through the application of a dopant foil. After that, the dopants are forced in a diffusion step into the silicon wafer and the masking layer is subsequently removed.

In another process step, a dopant for a p-conductivity, for example boron, is introduced and diffused into the silicon wafer on the top side of the wafer, and the same is done with a dopant for an n-conductivity, for example phosphorous, and on the back side. This can be accomplished quite simply by means of a foil diffusion, a boron foil being used on the top side and a phosphorous foil on the bottom side. In the case of a foil diffusion, a dopant-containing foil is placed on the silicon wafer, and the foil and silicon wafer, making up a composite, are heated together. At that point, the silicon wafer has a plurality of silicon structures comprising the layers 12, 13, 14 and 15.

As an alternative, the partial layer 15 can also be produced with the partial layer 13, and the p-layer 12 can subsequently be applied through epitaxial means. However, the surfaces of the wafer are still covered with an oxide as a result of the diffusion step. After this oxide is removed, a metallic coating is applied over the entire surface, on the top side and the bottom side. By dicing the silicon wafer, for example by means of sawing or scribing and breaking, a plurality of diode structures are formed, as shown in FIG. 4.

This method is especially cost-effective, since only the photolithographic structuring of the masking layer has to take place in the clean room. All other process steps can also be performed outside of a clean room. Furthermore, the foil diffusion is an especially cost-effective step, in particular when different dopants are introduced into a silicon wafer, starting from both sides. Since the n-partial layer 13 is a relatively large structure, in addition, especially simple and, thus, cost-effective exposure techniques can be used.

Figure 5:
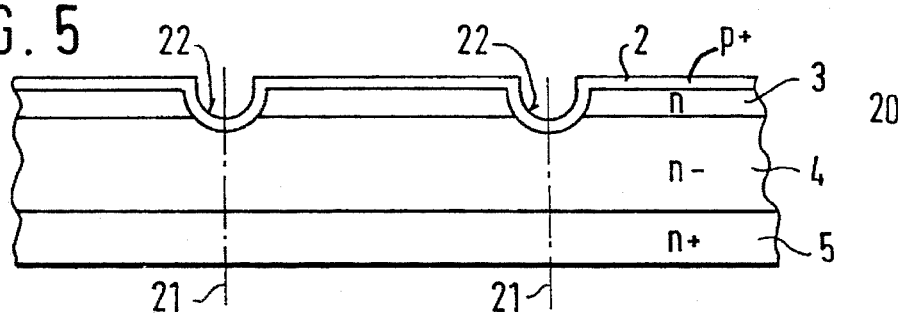
FIG. 5 illustrates the method for manufacturing the semiconductor arrangement shown in FIG. 3.

The manufacturing of the diodes according to FIG. 3 will be clarified on the basis of FIG. 5. The starting point is again a weakly doped n-wafer, whose dopant concentration corresponds to the dopant concentration of the partial layer 4. By means of a foil diffusion, n-dopant, for example phosphorus, is introduced to and diffused into the top side and the bottom side. This is again accomplished effectively by means of a foil diffusion. Thus, a layer is formed on the top side, whose dopant concentration corresponds to the partial layer 3, and a layer is formed on the bottom side, whose dopant concentration conforms to the partial layer 5. The dopant concentration of the layers is determined in this case by the dopant concentration of the foils.

Pits 22 are then introduced to the top side on the dividing lines 21, along which the silicon wafer is diced into individual silicon chips at the end of the manufacturing process. Pits 22 can be introduced, for example, by means of sawing or etching. The wafer surface is then cleaned before being processed further, in order to remove any particles that might remain from the top surface. After the pits 22 are introduced, a p-dopant, for example boron, is introduced into the top side. At the same time, the dopant concentration of the bottom layer 5 can be increased to the extent that seems advantageous. The p-dopant is again introduced by means of foil diffusion. In this diffusion step, any damage that might have occurred in the immediate vicinity of the pits 22 in the silicon monocrystal can be corrected. The pits 22 are formed at a depth that allows them to completely penetrate the n-layer 3 on the top side of the silicon wafer and reach the layer 4. As a result of the p-diffusion, the top layer of the silicon wafer is changed into a p-conductive region. The thickness of this p-layer is roughly the same over all of the top surface, in particular also in the pits.

A cross-section of a silicon wafer after this process step is shown in FIG. 5. FIG. 5 reveals the silicon structure of the diodes according to FIG. 3 between the two pits 22, or rather between the two dividing lines. However, prior to the dicing of the silicon wafer 20, a metallic coating is still applied to the top side and bottom side, over the entire surface. The silicon wafer is subsequently diced into a plurality of individual diodes according to FIG. 3.

This dicing operation is especially simple, in that the wafer is broken along the dividing lines 21, as breaking points formed by the pits 22 are incorporated in the silicon wafer 20. Furthermore, the breaking operation advantageously rules out any contamination of the side surfaces by metal particles, which are sometimes dispersed during the sawing operation, starting from the metallic coating on the side surface. What is especially advantageous about this method is that the process steps can all be performed outside of a clean room. No lithographic steps whatsoever are required to manufacture the diodes according to FIG. 3. In addition, all process steps are performed with an especially cost-effective foil diffusion. Thus, the costs for the individual diode elements can be kept low.

The forward voltage, i.e., the resistance of the diode, is influenced by the thickness of the weakly n-doped layer 4 or 14, when the diode is conductively connected. Therefore, it can be desirable to design this layer to be relatively thin, in order to reduce the forward voltage. For this purpose, silicon wafers can be used, which already have a very thick, heavily n-doped layer 5, 15 in the beginning stage, and only have a relatively thin, weakly n-doped layer 4, 14. Such silicon wafers are manufactured, for example, by joining a strongly and a weakly doped silicon wafer by means of a bonding process and mechanical reworking. Such a silicon wafer can also be used to manufacture the diodes according to FIGS. 3 and 4, in which case only the processes required on the top surface would then be performed.

What is claimed is:

1. A method for manufacturing a semiconductor arrangement, comprising the steps of:

forming a wafer having a first partial layer which is above a second partial layer which is, in turn, above a third partial layer, the first, second, and third partial layers being of the same conduction type, the first partial layer having a dopant concentration greater than the second partial layer;

introducing pits into a top side of the wafer by sawing the wafer, the pits extending through the first partial layer into the second partial layer;

introducing dopants into an entire cross-section of the top side of the wafer so as to alter the conduction type of a portion of the first partial layer and a portion of the second partial layer;

applying a metallic coating to the top side and to a bottom side of the wafer; and dicing the wafer into individual chips along the pits introduced into the top side of the wafer.

2. The method according to claim 1, wherein the step of dicing the wafer includes one of breaking the wafer and sawing the wafer.

3. The method according to claim 1, wherein the first partial layer, the second partial layer, and the third partial layer each include an n-layer and wherein the portion of the first partial layer into which the dopants are introduced includes a p-layer.

4. The method according to claim 1, wherein the metallic coating is applied to an entire surface of the top side of the wafer.

\* \* \* \* \*